(12) United States Patent
Meyer et al.

(10) Patent No.: US 7,705,590 B2
(45) Date of Patent: Apr. 27, 2010

(54) SQUID ARRANGEMENT

(75) Inventors: Hans-Georg Meyer, Jena (DE); Ronny Stolz, Apolda (DE); Viatcheslav Zakosarenko, Jena (DE); Matthias Meyer, Jena (DE); Winfried Rösel, Jena (DE)

(73) Assignees: Institut fuer Physikalische Hochtechnologie E.V., Jena (DE); Surpracon AG, Jena (DE)

( * ) Notice: Subject to any disclaimer, the term of this patent is extended or adjusted under 35 U.S.C. 154(b) by 695 days.

(21) Appl. No.: 11/527,669

(22) Filed: Sep. 22, 2006

(65) Prior Publication Data
US 2007/0096730 A1     May 3, 2007

(30) Foreign Application Priority Data
Sep. 23, 2005    (DE) ................ 10 2005 046 454

(51) Int. Cl.
*G01R 33/035*    (2006.01)
(52) U.S. Cl. ..................... 324/248; 505/846

(58) Field of Classification Search ............ 324/248;
505/162, 845–846; 327/527–528; 600/409;
326/5; 336/DIG. 1
See application file for complete search history.

(56) References Cited

U.S. PATENT DOCUMENTS

| | | | |
|---|---|---|---|
| 4,588,947 A | | 5/1986 | Ketchen |
| 5,319,307 A | * | 6/1994 | Simmonds ............ 324/248 |
| 5,343,147 A | | 8/1994 | Sager et al. |
| 5,646,526 A | * | 7/1997 | Takeda et al. ......... 324/248 |
| 5,781,009 A | * | 7/1998 | Lee et al. ............. 324/239 |
| 6,320,369 B1 | * | 11/2001 | Hidaka et al. ........ 324/117 R |
| 2005/0250651 A1 | * | 11/2005 | Amin et al. ........... 505/846 |

* cited by examiner

*Primary Examiner*—Bot L LeDynh
(74) *Attorney, Agent, or Firm*—Jordan and Hamburg LLP

(57) ABSTRACT

The invention relates to a SQUID arrangement for measuring a change in a magnetic field, the change in the magnetic field being caused by a specimen that is arranged in a magnetization field and the SQUID arrangement including a direct current SQUID. In order to provide a simple design in which the losses in the magnetic flux are also simultaneously minimized, it is provided that the SQUID itself is embodied for generating the magnetization field.

17 Claims, 1 Drawing Sheet

SQUID ARRANGEMENT

BACKGROUND OF THE INVENTION

The invention relates to a SQUID arrangement for measuring a change in the magnetic field having a direct current SQUID, the change in the magnetic field being caused by a specimen that is arranged in a magnetization field. Moreover, the invention relates to a method for measuring such a change. Finally, the method relates to the use of such a SQUID arrangement or such a method for various applications.

If the change in the magnetization of a specimen is to be measured, this specimen must be disposed for this purpose in a constant magnetic field, the so-called exciter field or magnetization field. A change in the magnetization of the specimen can then be detected as a change in the magnetic field. A superconducting quantum interference detector (SQUID) can measure such a change in the magnetic field in the surroundings of the specimen. The SQUID is coupled to the specimen via a flux transformer. However, the flux transformer transfers only a portion of the magnetic flux and thus also only a portion of the signal energy to the SQUID. Or, in particular in the case of very small specimens, there is direct coupling in that the specimen is placed directly in the SQUID loop. This can reduce a loss in magnetic flux. Such an arrangement is known for instance in U.S. Pat. No. 4,588,947. In both cases, the magnetization field is produced by a separate superconducting coil into which a so-called exciter current or magnetizing current is injected.

One object of the present invention is to provide a simple design in which the losses in the magnetic flux are also simultaneously minimized.

SUMMARY OF THE INVENTION

This object is attained using a SQUID arrangement according to the invention. According thereto, it is provided that the SQUID arrangement for measuring a change in a magnetic field, the change in the magnetic field being caused by a specimen arranged in a magnetization field, has a direct current SQUID and the SQUID itself is generates the magnetization field. Furthermore, this object is attained using a method according to the invention. According to it, in a SQUID arrangement having a direct current SQUID for measuring a change in a magnetic field, the change in the magnetic field being caused by a specimen arranged in a magnetization field, it is provided that the magnetization field is generated by the SQUID itself.

In other words, a fundamental idea of the invention is comprised in a novel SQUID design such that the quantization loop of the SQUID is used on the one hand as a measuring circuit and on the other hand for generating the magnetization field. In accordance with the invention, a current that flows in a part of the quantization loop induces the magnetization field and the change in specimen properties generates a magnetic flux directly in the SQUID.

The invention creates a solution in which, first, the specimen is better coupled to the SQUID, and second, magnetic scatter fields outside of the specimen are minimized.

Moreover, it is advantageous that the arrangement is comparatively simply constructed and does not require any separate superconducting coil for generating the magnetization field.

The inventive SQUID arrangements can be used particularly advantageously for instance for the following purposes:

in a susceptometer for measuring the magnetic susceptibility of a specimen, in particular in a micro-susceptometer for investigating extremely small particles, for measuring the penetration depth of a magnetic field into a superconducting specimen, in a magnetic (micro)-calorimeter for use in an x-ray detector, and, in a bolometer, in particular for detecting weak radiation, as an alternative for superconducting or semiconducting thermistors of the bolometer.

In accordance with a first embodiment of the invention, the SQUID has at least two superconducting current loops such that the current loops have a common line interrupted with two Josephson junctions, whereby the two current loops are arranged such that one closed superconducting path is possible that does not run through the Josephson junctions. For this, for the measuring operation, two current loops are preferably switched parallel to the two Josephson junctions such that a parallel gradiometer arrangement occurs like a double gradiometer. For coupling the magnetization current in as ring current, the two current loops are then switched in series so that an (external) current path results that does not run through the Josephson junctions.

In accordance with another embodiment of the invention, the magnetization current is a temporal non-decaying (persistent) current that is injected into the current loops when a part of one current loop is in the resistive state. This is preferably achieved in that a thermal switch for interrupting the superconduction is provided in one of the two current loops. The thermal switch is preferably connected to a heating element that locally disconnects the superconduction.

According to another embodiment of the invention, one of the two current loops receives the specimen, while the other current loop acts as reference loop and for coupling in the feedback flux. The change in the magnetic properties of the specimen causes a change in the flux distribution between the two current loops, which generates a SQUID signal.

It is particularly advantageous to place the SQUID arrangement including the specimen on a chip. Because of this, and because of the direct coupling of the specimen to the SQUID, extremely small SQUID sensors can be provided. This is very advantageous for cost effective, rapid, and effective cooling for maintaining operation of the superconductor.

Briefly stated, the present invention provides SQUID arrangement for measuring a change in a magnetic field having a direct current SQUID, the change in the magnetic field being caused by a specimen that is arranged in a magnetization field, and wherein the SQUID itself is embodied so at to generate the magnetization field.

As a feature of the above SQUID arrangement the SQUID has at least two superconducting current loops such that the two current loops have a common line interrupted with two Josephson junctions and the current loops are arranged such that one closed superconducting path is possible that does not run through said Josephson junctions.

A further feature of the above present invention includes optionally providing a thermal switch in one of the current loops for in interrupting the superconduction for injecting a magnetization current (I) into the closed superconducting path.

Yet another feature of the above present invention includes the option of providing the sample arranged in one of the current loops while the other current loop acts as reference loop. Still further an option of the present invention includes using the reference for coupling in feedback flux from a coil coupled thereto.

The present invention further provides a method for measuring a change in a magnetization field using a SQUID arrangement, wherein SQUID arrangement has a direct current SQUID and configured such that the change in the magnetic fluid is caused by a specimen that is arranged in the magnetization field and the magnetization field is generated by the SQUID itself.

Further still the above method of present invention provides for the SQUID having at least two superconducting current loops arranged such that the current loops have a common line interrupted with two Josephson junctions and the current loops are arranged such that a closed superconducting path is possible that does not run through said Josephson junctions and wherein an interruption in the superconduction for injecting a magnetization current (I) into the closed superconducting path is provided for using a thermal switch in one of the two current loops.

Another feature of the arrangement and method of the present invention includes use of the above arrangements and methods in a susceptometer for measuring the magnetic susceptibility of a specimen, in particular in a micro-susceptometer for investigating extremely small particles wherein the specimen is arranged in the magnetization field.

Still another feature of the arrangement and method of the present invention includes use of the above arrangements and methods for measuring a penetration depth of a magnetic field into a superconducting specimen.

Yet another feature of the arrangement and method of the present invention includes use of the above arrangements and methods in a magnetic (micro-) calorimeter for use in an x-ray detector.

Still a further feature of the arrangement and method of the present invention includes use of the above arrangements and methods in a bolometer, in particular for detecting weak radiation, as an alternative for superconducting or semiconducting thermistors of the bolometer.

One exemplary embodiment of the invention is described in greater detail in the following with reference to the drawing.

DETAILED DESCRIPTION OF THE INVENTION

Figure 1:
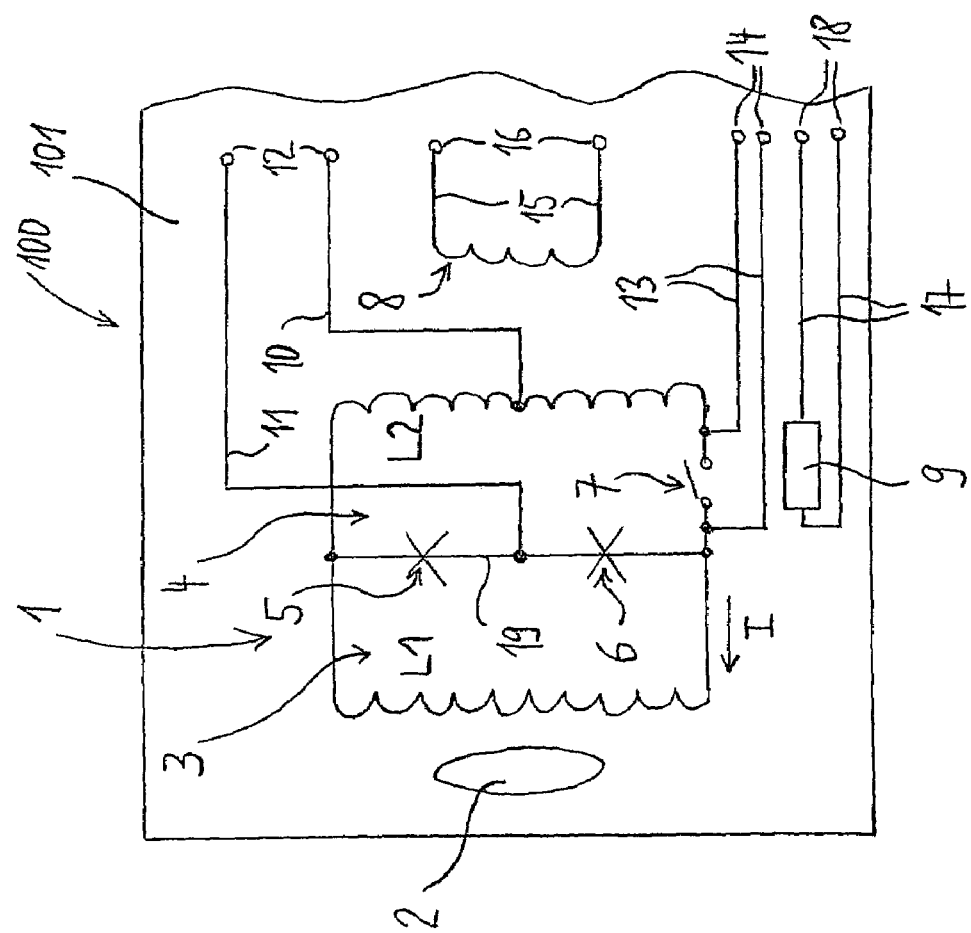
FIG. 1 provides a simplified schematic depiction of an inventive SQUID arrangement with its essential components.

The exemplary embodiment depicted illustrates a SQUID chip 100 and applied to its printed circuit board 101 is the entire SQUID arrangement with a direct current SQUID 1 and a specimen 2. This application is by means of thin-film technology, especially by means of sputtering or laser ablation.

The direct current SQUID 1 essentially includes a superconducting loop that it is interrupted by two sites. Such weak sites are also called Josephson junctions. The manner in which such a SQUID 1 functions is known in general. It is based on the effect of flux quantization and superconducting loops and on the Josephson effect and will not be explained in greater detail herein.

The direct current SQUID 1 in the exemplary embodiment has a superconducting current loop 3 that is interrupted by Josephson junctions 5, 6 and that has a coil L1. Connected in parallel to this coil L1 is another coil L2 that forms the current loop 4, which is also interrupted with the Josephson junctions 5, 6. In other words, the loops 3 and 4 form the quantization loops for the SQUID 1.

The current loops 3, 4 are arranged relative to one another such that a closed superconducting path is possible that does not run through the Josephson junctions 5, 6. The arrangement occurs in particular such that the two current loops 3, 4 are folded to the Josephson junctions 5, 6. This results in a line 19 that can be used jointly by both current circuits 3, 4 and on which the two Josephson junctions 5, 6 are arranged. The two current loops 3, 4 are switched together in series for coupling in a magnetization current I as ring current so that an external current path results that does not run through the Josephson junctions 5, 6.

The quantization loop of the SQUID 1 that results from the two current loops 3, 4 is thus used on the one hand as a measuring circuit and on the other hand for generating the magnetization field.

The magnetization current I is a persistent current that is coupled into the current loops 3, 4 when part of the current loop 4 is in a resistive state. This interruption in the superconduction in the illustrated exemplary embodiment is attained in that a thermal switch 7 is provided in the current loop 4 for interrupting the superconduction. The thermal switch 7 is arranged between the coil L2 and the common line 19 of the two current loops 3, 4. The thermal switch 7 has a heating element 9 and is activatable by this heating element such that the superconduction is disconnected. The heating element 9 is connected to connecting lines 17 and joined to a control unit of the SQUID 1 (not shown) via connector contacts 18.

The magnetization current I is coupled in via feed lines 13 that are connected to the current loop 4 on both sides of the thermal switch 7 and that are connected to a corresponding current source (not shown) via connector contacts 14. Once coupled in, the heating element 9 is deactivated and superconduction is restored. The external current source is connected to the connector contacts 14 of the SQUID chip 100 via a corresponding connecting cable (not shown). The current loop 3 receives the specimen 2, i.e. the specimen is disposed directly in the interior of this current loop 3, while the other current loop 4 acts as reference loop and for coupling in the feedback flux and thus for operating the flux regulating loop of the SQUID. The feedback flux is coupled in using a feedback or compensation coil 8 that is also arranged on the SQUID chip 101. The reaction coil 8 is connected to connecting lines 15 and connected via connector contacts 16 to a control unit (not shown) of the SQUID 1. The control unit is externally arranged and connected via connecting lines (not shown) to connector contacts 16.

A change in the magnetic properties of the specimen 2, for instance due to a change in temperature as a result of the absorption of an x-ray quantum, causes a change in the flux distribution between the two current loops 3, 4, which generates a SQUID signal. The pick-up of the SQUID signals occurs via a connecting line 10 to the second coil L2 and via a connecting line 11 connected to the common line 19 between the two Josephson contacts 5, 6. The evaluating unit (not shown) of the SQUID 1 is connected to the two connecting lines 10, 111 via the connector contacts 12. The evaluating unit is arranged externally and is connected to the connector contacts 12 via connecting lines (not shown).

The embodiments just described in the foregoing can for instance be used with a paramagnetic specimen when the SQUID chip 100 is employed in a magnetic calorimeter for use in an x-ray detector.

All of the features described in the specification, subsequent claims, and drawing can be essential to the invention both individually and in any desired combination with one another.

LEGENDS

1 Direct current SQUID
2 Specimen
3 First current loop
4 Second current loop
5 First Josephson junction
6 Second Josephson junction
7 Thermal switch
8 Reaction coil
9 Heater
10 Connecting line
11 Connecting line
12 Connector contact
13 Feed line
14 Connector contact
15 Connecting line
16 Connector contact
17 Connecting line
18 Connector contact
19 Common line
100 SQUID chip
101 Printed circuit board

The invention claimed is:

1. A SQUID arrangement for measuring a change in a magnetic field, comprising:
   a squid configuration having two superconducting current loops, the current loops comprising a common line portion common to each of the two loops, the common line portion being interrupted with two Josephson junctions;
   said current loops being configured to provide one closed superconducting path chat does not run through said common line and said Josephson junctions;
   said one closed superconducting path including a superconducting switch position to open said one closed superconducting path, and a current source connected to said one closed superconducting path configured to inject a persistent current during opening of the superconducting switch;
   said one closed current path being configured to produce a magnetizing field in a specimen area; and
   a specimen disposed in the specimen area and having a susceptance characteristic which changes in response to an outside influence such chat a change in a magnetic field is caused by the specimen that is arranged in the magnetization field and is detected by the squid configuration.

2. A SQUID arrangement comprising:
   two superconducting current loops, the current loops comprising a common line interrupted with two Josephson junctions;
   said current loops being configured to provide one closed superconducting path that does not run through said Josephson junctions; and
   said one closed superconducting path including a superconducting switch position to open said one closed superconducting path, and a current source connected to said one closed superconducting path configured to inject a persistent current during opening of the superconducting switch.

3. A SQUID arrangement for measuring a change in a magnetic field, comprising:
   a specimen positioned in a magnetization field such that the change in the magnetic field being caused by the specimen that is arranged in the magnetization field;
   a direct current SQUID comprising means for generating the magnetization field including two superconducting current loops, the two current loops comprising a common line interrupted with two Josephson junctions and said current loops providing one closed superconducting path that does not run through said Josephson junctions; and
   a thermal switch in one of said two current loops configured for interrupting the superconduction for injecting a magnetization current into the closed superconducting path.

4. SQUID arrangement in accordance with claim 2, further comprising the specimen and wherein the specimen is arranged in one of said current loops while the other current loop acts as a reference loop.

5. A method for measuring a change in a magnetic field, the change in the magnetic field being caused by the specimen, comprising selecting the specimen and disposing the specimen in the magnetization held generated by the SQUID arrangement of any one of claims 1 or 3.

6. A susceptometer for measuring magneti susceptibility, comprising the SQUID arrangement of claim 1 or 3 configured to accept introduction of the specimen.

7. A micro-susceptometer for measuring magnetic susceptibility of a specimen comprising an extremely small particle, comprising a SQUID arrangement of claim 1 or 3 configured to accept the extremely small particle as the specimen.

8. The method according to claim 5, wherein the specimen is superconducting and the penetration depth of a magnetic field into the specimen is measured.

9. An x-ray detector comprising a magnetic calorimeter, the magnetic calorimeter comprising the SQUID arrangement according to any one of claims 1-3 and the specimen being configured for x-ray detection.

10. An x-ray detector according to claim 9, wherein the magnetic calorimeter is a magnetic micro-calorimeter.

11. A bolometer for detecting weak radiation, comprising the SQUID arrangement according to any one of claims 1-3 and the specimen being configured for weak radiation detection.

12. A method of detecting x-rays, comprising exposing the x-ray detector of claim 9 to x-rays.

13. A method of detecting x-rays, comprising exposing the x-ray detector of claim 10 to x-rays.

14. A method of detecting weak radiation, comprising exposing the bolometer of claim 11 to weak radiation.

15. The SQUID arrangement according to claim 4 further comprising a coil coupled to the reference loop for introducing a feedback flux.

16. A SQUID arrangement in accordance with claim 1 or 3, wherein the specimen area is arranged in one of said current loops while the other current loop functions as a reference loop.

17. A SQUID arrangement in accordance with claim 2, further comprising one or the two current loops forming a specimen acceptance area arranged in the one of said current loops and the ocher current loop functioning as reference loop.

* * * * *